(12) United States Patent
Van Leeuwen et al.

(10) Patent No.: US 12,027,824 B2
(45) Date of Patent: Jul. 2, 2024

(54) LINEAR VCSEL ARRAYS

(71) Applicant: AMS SENSORS ASIA PTE. LTD., Singapore (SG)

(72) Inventors: Robert Van Leeuwen, Mercerville, NJ (US); Laurence Watkins, Pennington, NJ (US); Maik Scheller, Lawrencevllle, NJ (US)

(73) Assignee: AMS SENSORS ASIA PTE. LTD., Singapore (SG)

( * ) Notice: Subject to any disclaimer, the term of this patent is extended or adjusted under 35 U.S.C. 154(b) by 634 days.

(21) Appl. No.: 17/272,930

(22) PCT Filed: Sep. 4, 2019

(86) PCT No.: PCT/SG2019/050443
§ 371 (c)(1),
(2) Date: Mar. 3, 2021

(87) PCT Pub. No.: WO2020/050777
PCT Pub. Date: Mar. 12, 2020

(65) Prior Publication Data
US 2021/0320478 A1    Oct. 14, 2021

Related U.S. Application Data

(60) Provisional application No. 62/726,836, filed on Sep. 4, 2018.

(51) Int. Cl.
*H01S 5/42* (2006.01)
*H01S 5/183* (2006.01)
*H01S 5/40* (2006.01)

(52) U.S. Cl.
CPC .......... *H01S 5/423* (2013.01); *H01S 5/18394* (2013.01); *H01S 5/4018* (2013.01)

(58) Field of Classification Search
CPC .......... H01S 5/42–423; H01S 5/18394; H01S 5/18308–18319; H01S 5/4018
See application file for complete search history.

(56) References Cited

U.S. PATENT DOCUMENTS 5,332,910 A * 7/1994 Haraguchi ............. H01S 5/183
257/17
5,978,403 A * 11/1999 Iwasa ................ G02F 1/134336
372/109

(Continued)

FOREIGN PATENT DOCUMENTS

CN    101542854 A    9/2009
CN    102742100 B *  6/2015 ......... B23K 26/0608

(Continued)

OTHER PUBLICATIONS

International Patent Application No. PCT/SG2019/050443, "International Search Report", mailed Dec. 12, 2019, 4 pages.

(Continued)

*Primary Examiner* — Joshua King
(74) *Attorney, Agent, or Firm* — Viering, Jentschura & Partner mbB (57) ABSTRACT

The present disclosure describes various linear VCSEL arrays, as well as VCSEL array chips incorporating such linear VCSEL arrays, and modules, host devices and other apparatus into which one or more of the linear VCSEL arrays are integrated. Implementations can include, for example, varying the aperture size of the VCSELs, tapering the shape of the transmission line, and/or changing the density of the VCSELs.

6 Claims, 7 Drawing Sheets

(56) References Cited

U.S. PATENT DOCUMENTS

| | | | | |
|---|---|---|---|---|
| 2002/0028390 | A1* | 3/2002 | Mazed | G02B 6/4277 |
| | | | | 430/296 |
| 2002/0076841 | A1* | 6/2002 | Chang | H01S 5/0014 |
| | | | | 438/15 |
| 2002/0175388 | A1* | 11/2002 | Miyahara | G02B 6/4201 |
| | | | | 257/443 |
| 2005/0078726 | A1* | 4/2005 | Watanabe | B82Y 20/00 |
| | | | | 372/46.01 |
| 2005/0169327 | A1* | 8/2005 | Eden | H01S 5/4031 |
| | | | | 372/32 |
| 2006/0109883 | A1* | 5/2006 | Lewis | H04N 9/3111 |
| | | | | 372/50.12 |
| 2008/0205459 | A1* | 8/2008 | Yonekubo | H01S 5/024 |
| | | | | 372/66 |
| 2011/0274131 | A1* | 11/2011 | Takaki | H01S 5/423 |
| | | | | 372/50.124 |
| 2011/0294236 | A1* | 12/2011 | Masui | H01S 5/18347 |
| | | | | 257/E21.529 |
| 2012/0328229 | A1* | 12/2012 | Kogo | G02B 6/4201 |
| | | | | 385/88 |
| 2014/0376092 | A1* | 12/2014 | Mor | H01S 5/423 |
| | | | | 359/569 |
| 2015/0260830 | A1* | 9/2015 | Ghosh | G01S 7/484 |
| | | | | 250/208.1 |
| 2016/0141839 | A1* | 5/2016 | Matsubara | H01S 5/423 |
| | | | | 372/38.05 |
| 2016/0156157 | A1* | 6/2016 | Matsubara | H01S 5/0042 |
| | | | | 438/18 |
| 2016/0197452 | A1* | 7/2016 | Mor | H01S 5/423 |
| | | | | 359/569 |
| 2017/0353012 | A1* | 12/2017 | Barve | H01S 5/423 |
| 2018/0059430 | A1* | 3/2018 | Mor | H01S 5/02253 |
| 2018/0067341 | A1* | 3/2018 | Kanazawa | H01S 5/0265 |
| 2018/0109071 | A1* | 4/2018 | Brocato | H01P 5/12 |
| 2018/0301875 | A1* | 10/2018 | Burroughs | H01S 5/02253 |
| 2019/0199063 | A1* | 6/2019 | Barve | H01S 5/18311 |

FOREIGN PATENT DOCUMENTS

| | | | | |
|---|---|---|---|---|
| CN | 109672085 A | * | 4/2019 | H01L 21/76832 |
| JP | 2019036584 A | * | 3/2019 | G02B 6/4201 |
| WO | WO-2009119850 A1 | * | 10/2009 | G02B 6/125 |
| WO | WO-2014087301 A1 | * | 6/2014 | G03B 15/02 |
| WO | 202050777 A1 | | 3/2020 | |
| WO | WO-2020078432 A1 | * | 4/2020 | G02B 6/4245 |

OTHER PUBLICATIONS

International Patent Application No. PCT/SG2019/050443, "Written Opinion", mailed Dec. 12, 2019, 7 pages.

Office Action from related application, CN Appl. No. 201980057858.2, issued Jul. 29, 2023, 16 pages.

\* cited by examiner

LINEAR VCSEL ARRAYS

CROSS-REFERENCE TO RELATED APPLICATIONS

This application is a 371 U.S. National Phase of PCT International Patent Application No. PCT/SG2019/050443, filed on Sep. 4, 2019, which claims benefit and priority to U.S. provisional patent application No. 62/726,836, filed on Sep. 4, 2018; the disclosures of which are each incorporated by reference herein in their entirety for all purposes.

FIELD OF THE DISCLOSURE

The present disclosure relates to linear vertical-cavity surface-emitting laser (VCSEL) arrays.

BACKGROUND

Lasers, such as VCSELs, can be used in a wide range of applications, including distance or ranging applications (e.g., light detection and ranging (LIDAR) systems operable to acquire three-dimensional information about an environment). In some cases, multiple VCSELs are arranged in a linear array in which the VCSELs are electrically connected together, as well as electrically connected to a transmission line having a conductive contact pad at one end to allow the VCSELs to be activated or deactivated. The finite resistance of the transmission line between the individual VCSELs can cause a voltage drop that reduces the resulting voltage at VCSELs further from the contact pad. Because the current and optical power scale with the applied voltage, the difference in voltages across the VCSELs in the linear array can result in a reduced light output for VCSELs further from the contact pad. Thus, the optical power produced by each of the VCSELs in the linear array may differ from one another, which for some applications is undesirable. Further, the differences in voltages across the VCSELs may produce a difference in timing in the activation or deactivation of the individual VCSELs in the linear array. Such delays may be undesirable for some applications (e.g., high-speed operation).

SUMMARY

The present disclosure describes various linear VCSEL arrays, as well as VCSEL array chips incorporating such linear VCSEL arrays, and modules, host devices and other apparatus into which one or more of the linear VCSEL arrays are integrated.

For example, in one aspect, the disclosure describes an optical source that includes a linear array of VCSELs arranged along a transmission line including a conductive contact pad at one end. The VCSELs are electrically connected together, and are electrically connected to the transmission line. Each of the VCSELs has a respective aperture, and each of the apertures has a respective size such that apertures of VCSELs closer to the contact pad are smaller than apertures of VCSELs further from the contact pad.

Some implementations include one or more of the following features. For example, in some instances, the respective apertures of the VCSELs are increasingly larger in a direction away from the contact pad. In some cases, the respective sizes of the VCSEL apertures are such that the VCSELs are operable to emit substantially homogenous optical power.

In another aspect, an optical source includes a linear array of VCSELs arranged along a transmission line including a conductive contact pad at one end, wherein the VCSELs are electrically connected together, and are electrically connected to the transmission line. The transmission line has a first end closer to the contact pad and a second end further from the contact pad, and the transmission line is wider at the first end than the second end.

In some implementations, the transmission line has a width that decreases with distance from the contact pad. Further, in some implementations, the transmission line has a width that continuously decreases with distance from the contact pad. For example, the transmission line can have a tapered shape.

In accordance with a further aspect, the disclosure describes an optical source that includes a linear array of VCSELs arranged along a transmission line including a conductive contact pad at one end, wherein the VCSELs are electrically connected together, and are electrically connected to the transmission line. The transmission line has a first end closer to the contact pad and a second end further from the contact pad, and a density of the VCSELs closer to the second end is greater than a density of the VCSELs closer to the first end.

Some implementations include one or more of the following features. For example, in some instances, the density of the VCSELs continuously increases from the first end to the second end. In some implementations, the VCSELs are arranged along the transmission line so that the VCSELs in the linear array are operable, collectively, to project a substantially uniform line of light onto an object. In other implementations, the VCSELs are arranged so that, collectively, they project a particular non-uniform or non-homogenous power pattern.

The present disclosure also describes an optical source that includes multiple linear arrays of VCSELs such as those described above, as well as others. In some cases, the linear arrays are separately addressable from one another. Further, in some instances, the linear arrays are integrated in a monolithic two-dimensional VCSEL array.

The disclosure also describes additional implementations of linear VCSEL arrays. For example, an optical source can include a linear array of VCSELs arranged along a transmission line including a first conductive contact pad at a first end and a second conductive pad at a second end. The VCSELs are electrically connected together, and are electrically connected to the transmission line. Each of the VCSELs has a respective aperture, and each of the apertures has a respective size such that apertures of VCSELs closer to at least one of the first or second contact pads are smaller than apertures of VCSELs in a middle region of the transmission line. In some instances, the respective apertures of the VCSELs are increasingly larger in a direction from the first contact pad toward the middle region of the transmission line and are increasingly larger in a direction from the second contact pad toward the middle region of the transmission line. In some cases, the respective sizes of the VCSEL apertures are such that the VCSELs are operable to emit substantially homogenous optical power.

In some implementations, an optical source includes a linear array of VCSELs arranged along a transmission line including a first conductive contact pad at a first end and a second conductive pad at a second end. The VCSELs are electrically connected together, and are electrically connected to the transmission line. The transmission line has a middle region distant from the first end and from the second end, and the transmission line is wider at the first end and the second end than in the middle region. Thus, in some instances, the transmission line has a width that continuously decreases with distance from the first contact pad toward the middle region and that continuously decreases with distance from the second contact pad toward the middle region. In some implementations, the transmission line has a tapered shape from the first end toward the middle region and has a tapered shape from the second end toward the middle region.

The disclosure further describes an optical source that includes a linear array of VCSELs arranged along a transmission line including a first conductive contact pad at a first end and a second conductive pad at a second end. The VCSELs are electrically connected together, and are electrically connected to the transmission line. The transmission line has a middle region distant from the first end and from the second end, and a density of the VCSELs closer to the middle region is greater than a density of the VCSELs closer to the first end and the second end. In some implementations, the density of the VCSELs continuously increases from the first end toward the middle region, and the density of the VCSELs continuously increases from the second end toward the middle region.

In some implementations, the VCSELs in the array are operable to emit a relatively homogenous optical power or collectively can project a more uniform line of light. In other applications, a specific non-uniform or non-homogenous power profile may be desirable. For example, the power at the end VCSEL elements may be increased to counteract power drop-off in the projection system. A non-uniform power profile can be advantageous, for example, in a projection system on a flat surface. Thus, in some implementations, the power distribution can be higher for VCSEL elements closer to the end of the transmission line to compensate for the drop-off in power that may occur as a result of cosine effects.

The disclosure further describes an apparatus for optical sensing or imaging. The apparatus includes an optical source including one or more linear VCSEL arrays in accordance with any of the foregoing implementations or others implementations described here. The optical source can be operable to illuminate an object with radiation. The apparatus also can include, for example, a current driver operable to activate the optical source, a receiver operable to detect radiation reflected by the object, and a processor operable to receive and process a signal proportional to the detected radiation.

The disclosure further describes a host device (e.g., a smartphone) that includes an optical source including one or more linear VCSEL arrays in accordance with any of the foregoing implementations or others implementations described here. The optical source is operable to illuminate an object with radiation. The host device also can include, for example, a receiver operable to detect radiation reflected by the object, a communications interface, a transceiver, and a supplemental module. The supplemental module is operable to respond to one or more signals from the receiver and to alter a state of the supplemental module in response to the one or more signals.

In some instances, the accuracy of collected data can be improved by incorporating an optical source that includes one or more linear VCSEL arrays or VCSEL array chips as described above into an optoelectronic module or host device. Improving the accuracy of the collected data can, in turn, improve the operation of the host device, for example, with respect to operations or functions that respond to, or are based on the collected data.

Other aspects, features and advantages will be readily apparent from the following detailed description, the accompanying drawings, and the claims.

DETAILED DESCRIPTION

Figure 1:
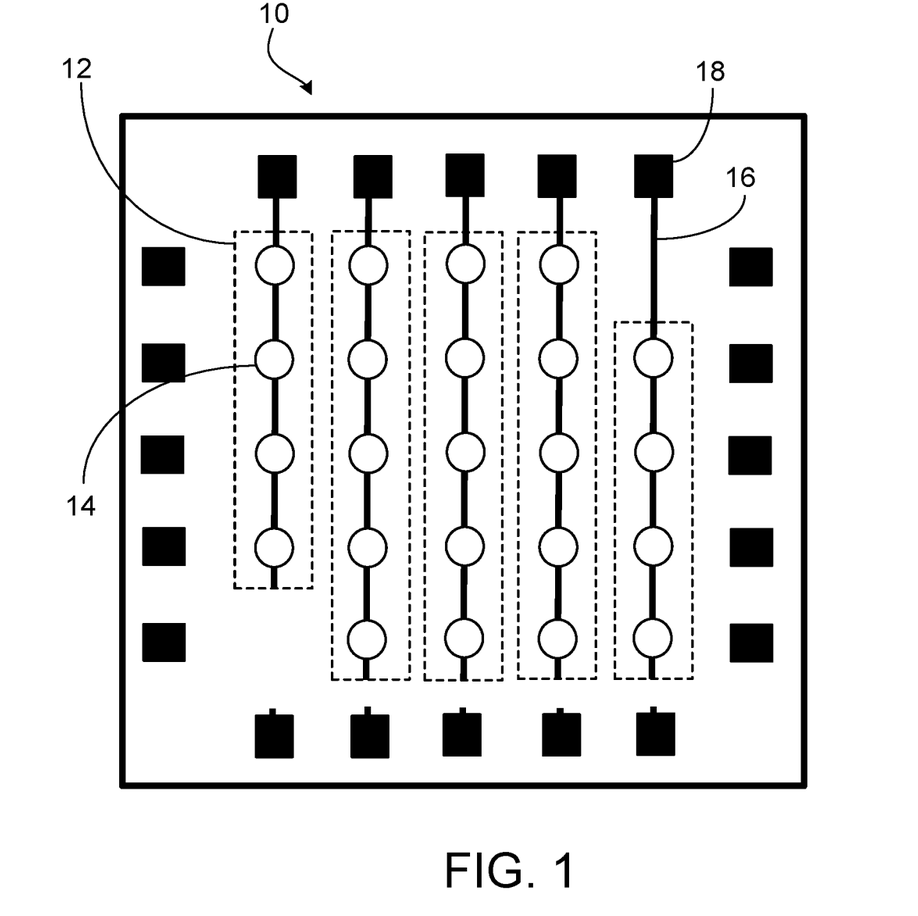
FIG. 1 illustrates an example of a top view of a chip including linear arrays of VCSELs.

FIG. 1 shows an example of a monolithic two-dimensional VCSEL array 10 that includes separately addressable linear sub-arrays 12 of VCSELs 14. Each linear sub-array 12 of VCSELs 14 can be formed by arranging multiple VCSEL chips 14 end-to-end. The VCSELs 14 in each respective linear sub-array are connected electrically to one another by a common conductive trace 16 which serves as a transmission line. The traces 16 can be composed, for example, of gold and are separated from one another by a small spacing to prevent electrical shorting. At least one end of each conductive trace 16 is connected electrically to a respective conductive bonding pad 18 which serves as a first electrode for the VCSELs in the particular linear sub-array 12. Each linear sub-array 12 can be addressed (and activated or deactivated) via the respective bonding pad 18. The rear side of the array 10 (not shown in FIG. 1) can have a common metallization, which serves as the second electrode for all the sub-arrays 12 and VCSELs 14. In some cases, an entire VCSEL array chip on a common substrate is placed on a submount, which in turn is mounted on a heat sink for cooling the VCSELs.

As described in greater detail, a number of approaches can be implemented so that the VCSELs 14 in a given linear sub-array 12 are operable to emit a more uniform optical power with respect to one another. Alternatively, in some applications, a specific non-uniform or non-homogenous power profile may be desirable. For example, the power of the VCSELs 14 may be adjusted to counteract power drop-off in the projection system. The approaches described below, which can be used individually or in combination, include varying the size of the VCSELs 14 (i.e., their respective apertures) along a given transmission line 16 and/or tapering the shape of the transmission line 16. Some implementations may include changing the density of the VCSELs 14 along the given transmission line 16.

Figure 2:
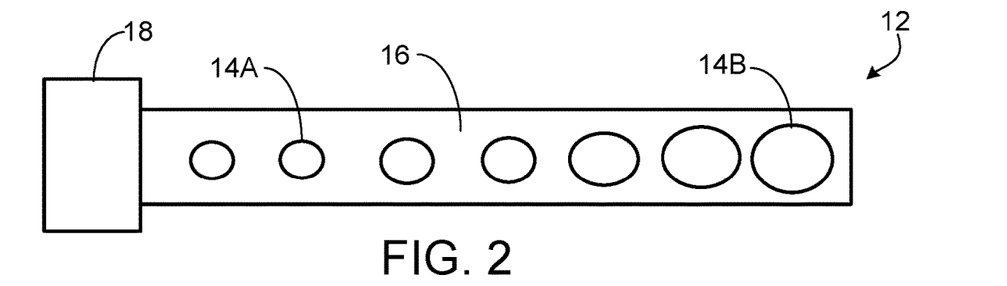
FIG. 2 illustrates a first example of a linear VCSEL array.

As shown in FIG. 2, in some implementations, the aperture size of the VCSELs 14 along a particular transmission line 16 is varied to improve the voltage distribution and the homogeneity of the emitted optical power. In particular, the apertures of VCSELs 14A closer to the beginning of the transmission line 16 (i.e., closer to the contact pad 18) are made increasingly smaller than the apertures of VCSELs 14B further from the beginning of the transmission line 16, which allows for wider metal areas around the VCSELs. The VCSEL apertures can be formed in various ways depending on the particular implementation (e.g., oxidized apertures or ion implanted apertures).

The resistance (Remitter) of a particular VCSEL 14 increases with decreasing aperture size. Thus, gradually increasing the diameter of the apertures of the VCSELs 14 along the transmission line 16 decreases the resistance of the VCSELs further from the contact pad 18 such that VCSELs 14A closer to the beginning of the transmission line 16 have higher resistance than the VCSELs 14B at the end. Although a voltage drop along the transmission line 16 still occurs because of the finite resistivity, the smaller VCSELs 14A closer to the contact pad 18 will emit less power at a given applied voltage than the larger VCSELs 14B further from the contact pad 18. The relative sizes of the VCSEL apertures can be chosen to optimize the homogeneity of the emitted power along the linear array 12.

Figure 3:
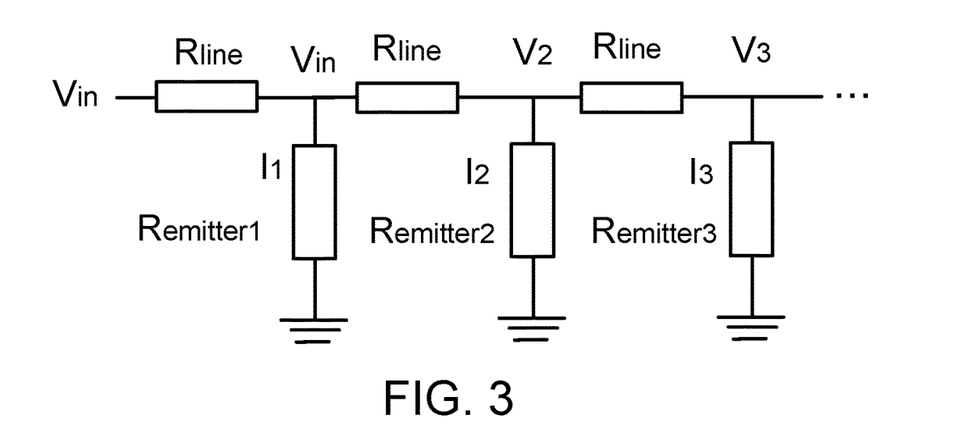
FIG. 3 shows a simplified equivalent circuit for the linear VCSEL array of FIG. 2.

The foregoing approach is illustrated schematically by the equivalent circuit of FIG. 3, in which the resistance (Remitter(n+1)) of a VCSEL further from the contact pad 18 is less than the resistance (Remitter(n)) of a VCSEL closer to the contact pad, and the voltage (V(n+1)) across a VCSEL further from the contact pad 18 is less than the voltage (V(n)) across a VCSEL closer to the contact pad. The relative sizes of the VCSELs 14 can be chosen so that the power emitted by the individual VCSELs 14 along the linear array 12 is substantially homogenous (i.e., Pemitter(n+1) ≈Pemitter(n)).

Figure 4:
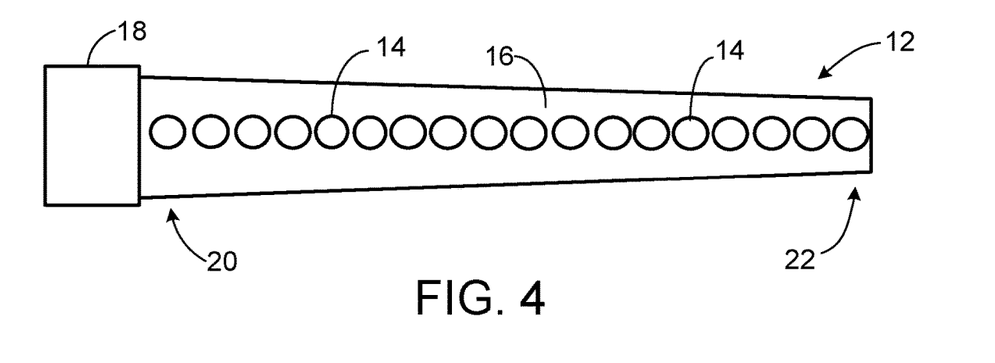
FIG. 4 illustrates a second example of a linear VCSEL array.

FIG. 4 illustrates another approach in which the shape of the transmission line 16 is varies such that the width of the transmission line is wider at the end 20 closer to the contact pad 18 and narrower at the end 22 further from the contact pad. The variation in the width of the transmission line 16 can be chosen so that the optical power emitted by the various VCSELs 14 along the linear array 12 is substantially homogenous. In some instances, as shown in FIG. 4, the transmission line 16 has a tapered shape that narrows from its wider end 20 closer to the contact pad 18 toward its narrower end 22 further from the contact pad. In the illustrated example, the VCSELs 14 have substantially the same aperture size as one another.

Figure 5:
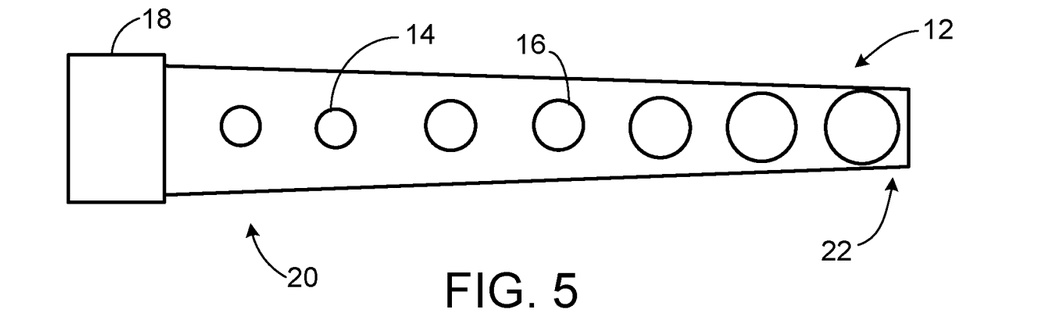
FIG. 5 illustrates a third example of a linear VCSEL array.

As shown in the example of FIG. 5, the approaches of FIGS. 2 and 4 can be combined. Thus, in some instances, the linear array 12 includes a transmission line 16 that is wider at the end 20 closer to the contact pad 18 and narrower at the end 22 further from the contact pad (e.g., a tapered shape), and also includes VCSELs 14 having aperture sizes that differ from one another (e.g., VCSELs further from the contact pad 18 have larger apertures). The specific width of the transmission line and the sizes of the VCSEL apertures can be chosen so that the optical power emitted by the various VCSELs 14 along the linear array 12 is substantially homogenous (i.e., uniform).

Figure 6:
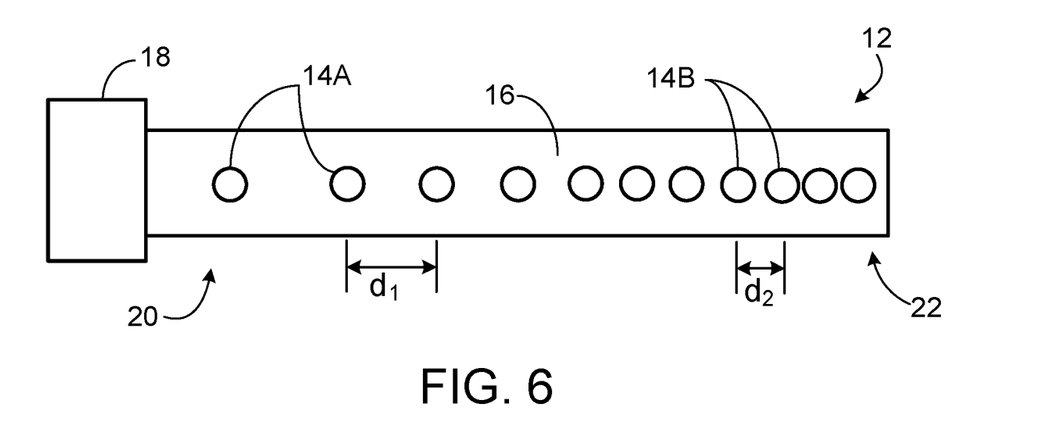
FIG. 6 illustrates a fourth example of a linear VCSEL array.

In some applications, it is not necessary for each of the VCSELs 14 in the linear array to emit substantially homogenous optical power. However, it still may be desirable for the overall optical power emitted by the VCSELs 14 in the linear array 12 to be such that a substantially uniform line of light is projected by the linear array. In such cases, the density of VCSELs 14 along the transmission line 16 can be varied to account for the change in resistance along the transmission line 16, and the associated reduction in optical power output by the VCSELs 14 that are further from the contact pad 18. The VCSEL density (i.e., a distance 'd' separating adjacent VCSELs in the linear array) can vary so as to achieve a substantially uniform optical power projected by the linear array 12. FIG. 6 illustrates an example in which adjacent VCSELs 14B that are closer to the end 22 of the transmission (i.e., further from the contact pad 18) are closer to one another than are adjacent VCSELs 14A that are closer to the contact pad 18. Thus, for example, the distance $d_1$ separating adjacent VCSELs closer to the contact pad 18 is greater than the distance $d_2$ separating VCSELs further from the contact pad. In this example, the VCSEL density increases continuously from the end 20 of the transmission line 16 (i.e., the end closer to the contact pad 18) toward the end 22 of the transmission line 16 (i.e., the end further from the contact pad 18).

Although the foregoing examples illustrate linear VCSEL arrays that have a contact pad 18 at one end, some implementations may include two contact pads, one at each end of the linear array. FIGS. 7 through 10 illustrate various examples and are discussed in greater detail below.

Figure 7:
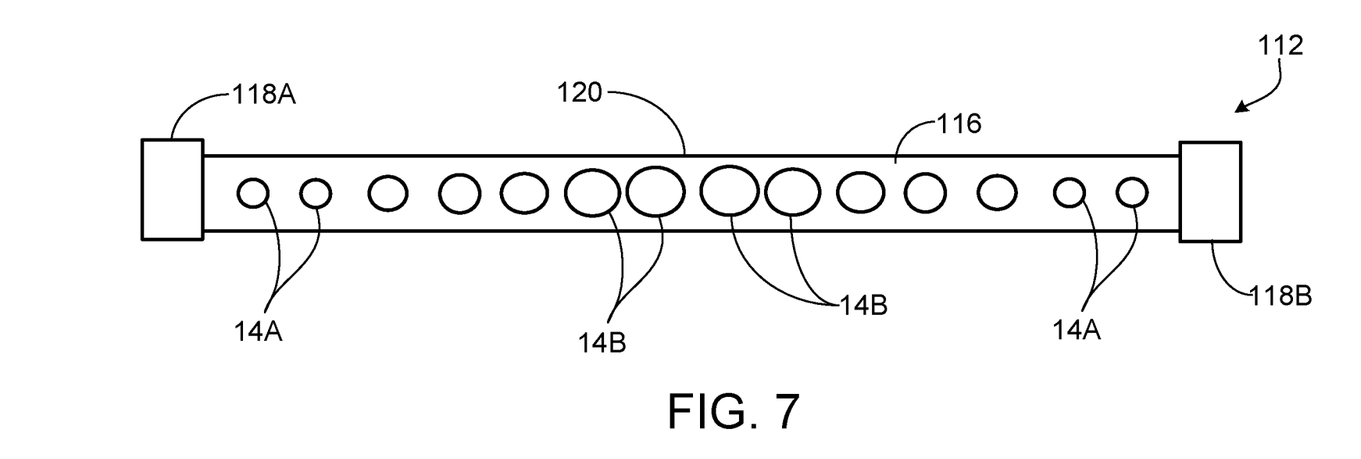
FIG. 7 illustrates a fifth example of a linear VCSEL array.

In some such cases, the VCSEL aperture size (or VCSEL density) increases from each of the respective contact pads toward a middle section (e.g., the center) of the transmission line. FIG. 7 illustrates an example of such a linear VCSEL array 112 that includes a first contact pad 118A at one end and a second contact pad 118B at the other end. In this example, the VCSEL aperture size is increasingly larger for VCSELs 14B that are closer to the middle 120 of the transmission line 116, whereas the VCSEL aperture size is increasingly smaller for VCSELs 14A that are closer to either of the contact pads 118A, 118B. Although the linear array of FIG. 7 is symmetric about the center 120 of the transmission line 116, in some implementations, that is not the case. The variation in VCSEL aperture size can be chosen, for example, so that the optical power emitted by the various VCSELs 14A, 14B along the linear array 112 is substantially homogenous (i.e., uniform).

Figure 8:
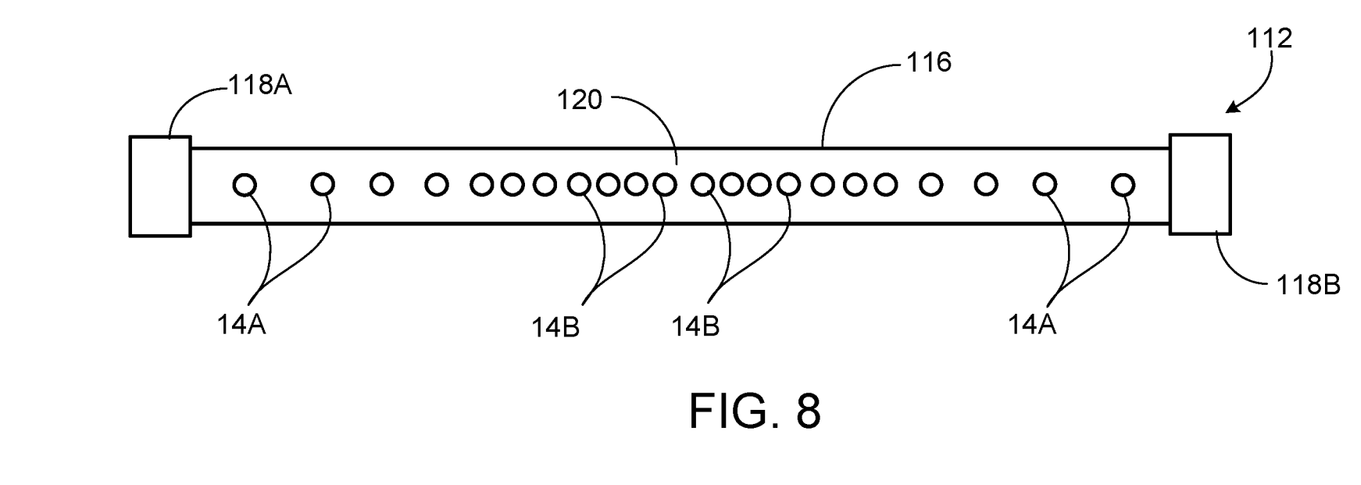
FIG. 8 illustrates a sixth example of a linear VCSEL array.

FIG. 8 illustrates an example of a VCSEL linear array 112 in which the VCSEL density is increasingly greater for VCSELs 14B that are closer to the middle (e.g., the center) 120 of the transmission line 116, whereas the VCSEL density is increasingly smaller for VCSELs 14A that are closer to either of the contact pads 118A, 118B. The varying VCSEL density can be chosen, for example, so as to achieve a substantially uniform line of light projected by the linear array.

Figure 9:
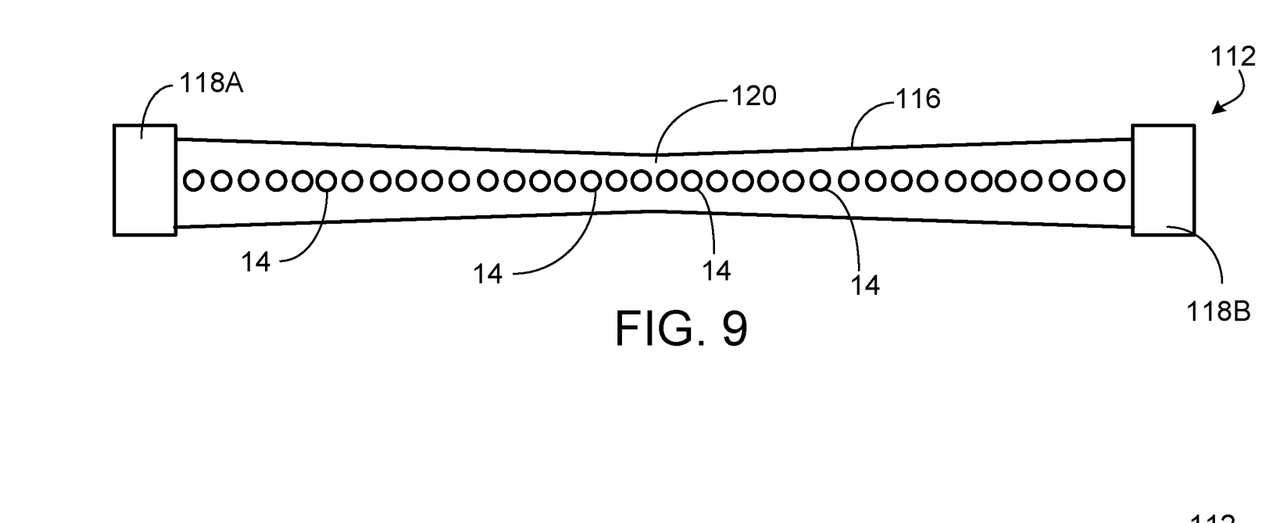
FIG. 9 illustrates a seventh example of a linear VCSEL array.

FIG. 9 illustrates an example of a VCSEL linear array in which the width of the transmission line decreases (e.g., in a tapered shape) from each of the contact pads 118A, 118B toward the middle (e.g., the center) 120 of the transmission line 116. The variation in transmission line width can be chosen, for example, so that the optical power emitted by the various VCSELs 14 along the linear array is substantially homogenous (i.e., uniform).

Figure 10:
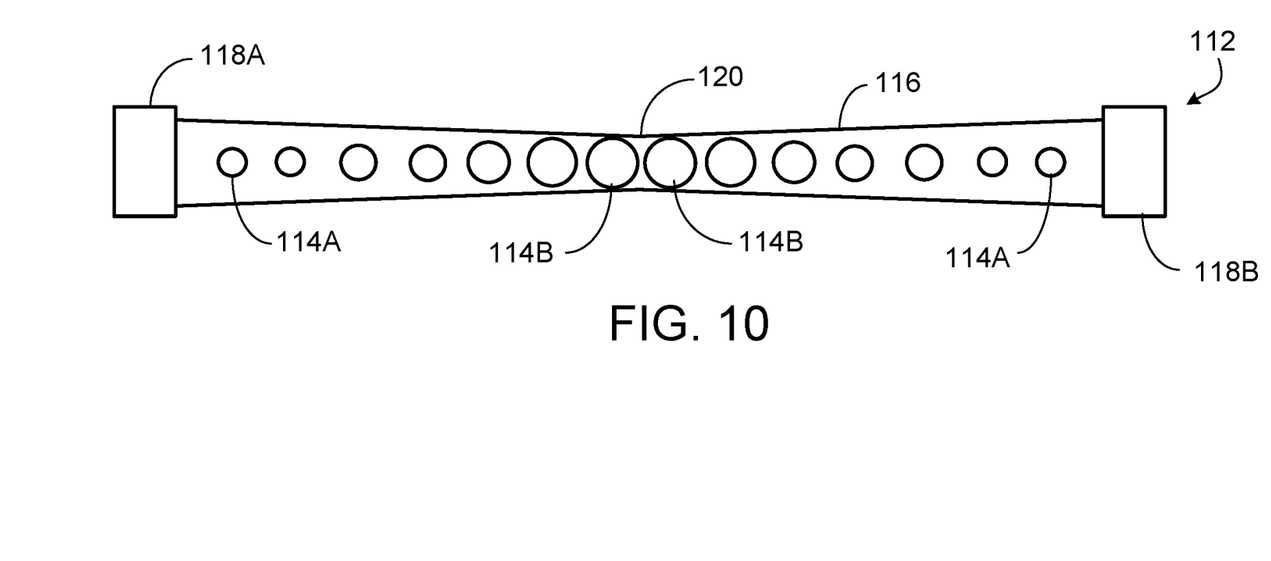
FIG. 10 illustrates a eighth example of a linear VCSEL array.

FIG. 10 illustrates an example of a VCSEL linear array that combines features of FIGS. 7 and 9. Thus, the VCSEL aperture size is increasingly larger for VCSELs 114B that are closer to the middle 120 of the transmission line 116, whereas the VCSEL aperture size is increasingly smaller for VCSELs 114A that are closer to either of the contact pads 118A, 118B. Further, the width of the transmission line decreases (e.g., in a tapered shape) from each of the contact pads 118A, 118B toward the middle 120 of the transmission line 116. The specific width of the transmission line and the sizes of the VCSEL apertures can be chosen so that the optical power emitted by the various VCSELs along the linear array is substantially homogenous.

Figure 11:
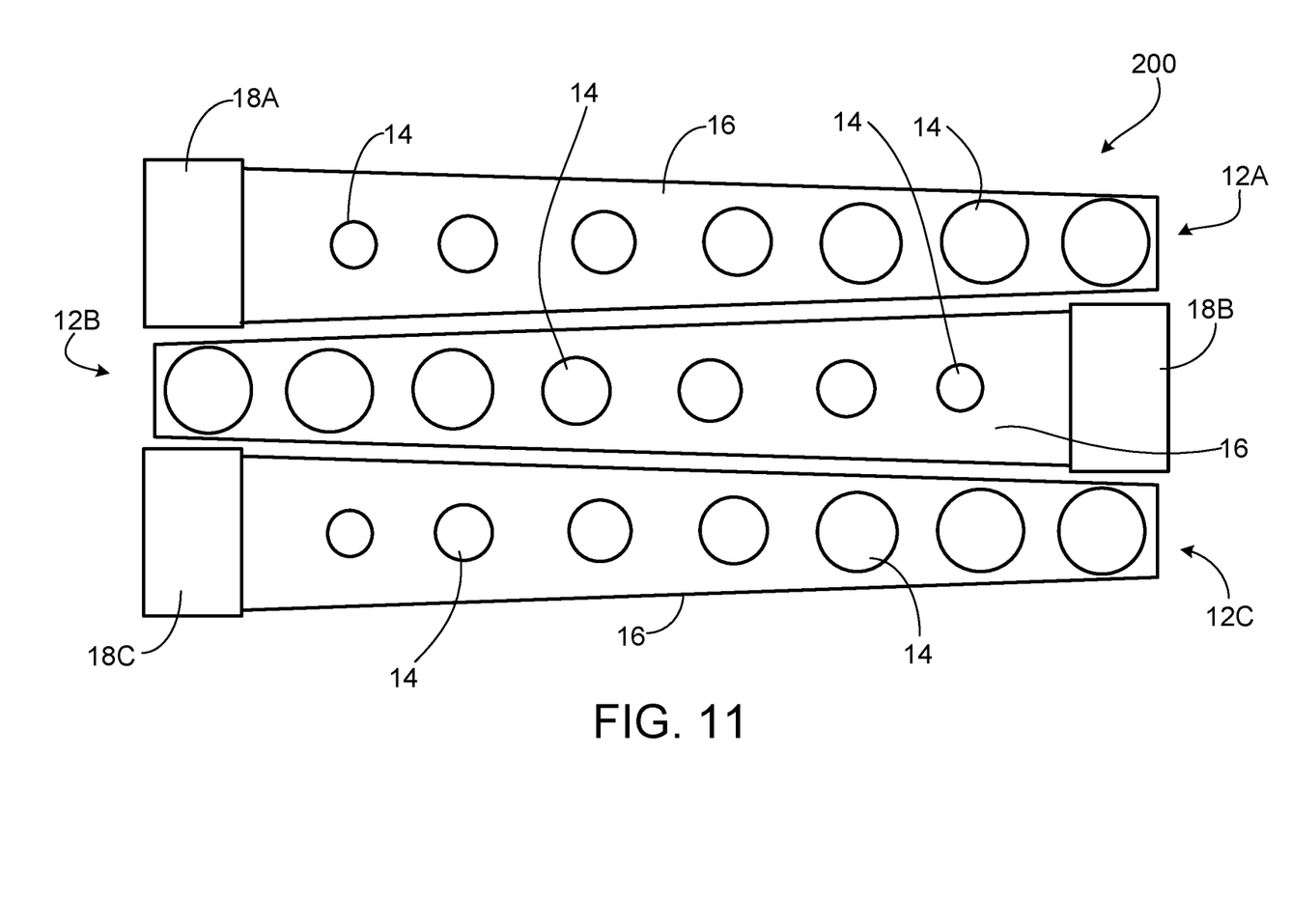
FIG. 11 illustrates an example of an array of separately addressable linear VCSEL sub-arrays.

Multiple, separately addressable, linear VCSEL arrays 12 (or 112), in accordance with any of the implementations described above, can be integrated as part of a monolithic two-dimensional VCSEL array (see FIGS. 1 and 11). As shown in FIG. 11, each particular linear VCSEL sub-array 12A, 12B, 12C in the array 200 includes a respective contact pad 18A 18B, 18C. Thus, all the VCSELs 14 in a particular linear sub-array can be activated (or deactivated) by selectively applying a voltage to the corresponding contact pad. By using linear VCSEL sub-arrays such as in FIG. 4 or 5 in which the transmission lines 16 are tapered, the overall combined area of the array 200 can be reduced in some instances.

Figure 12:
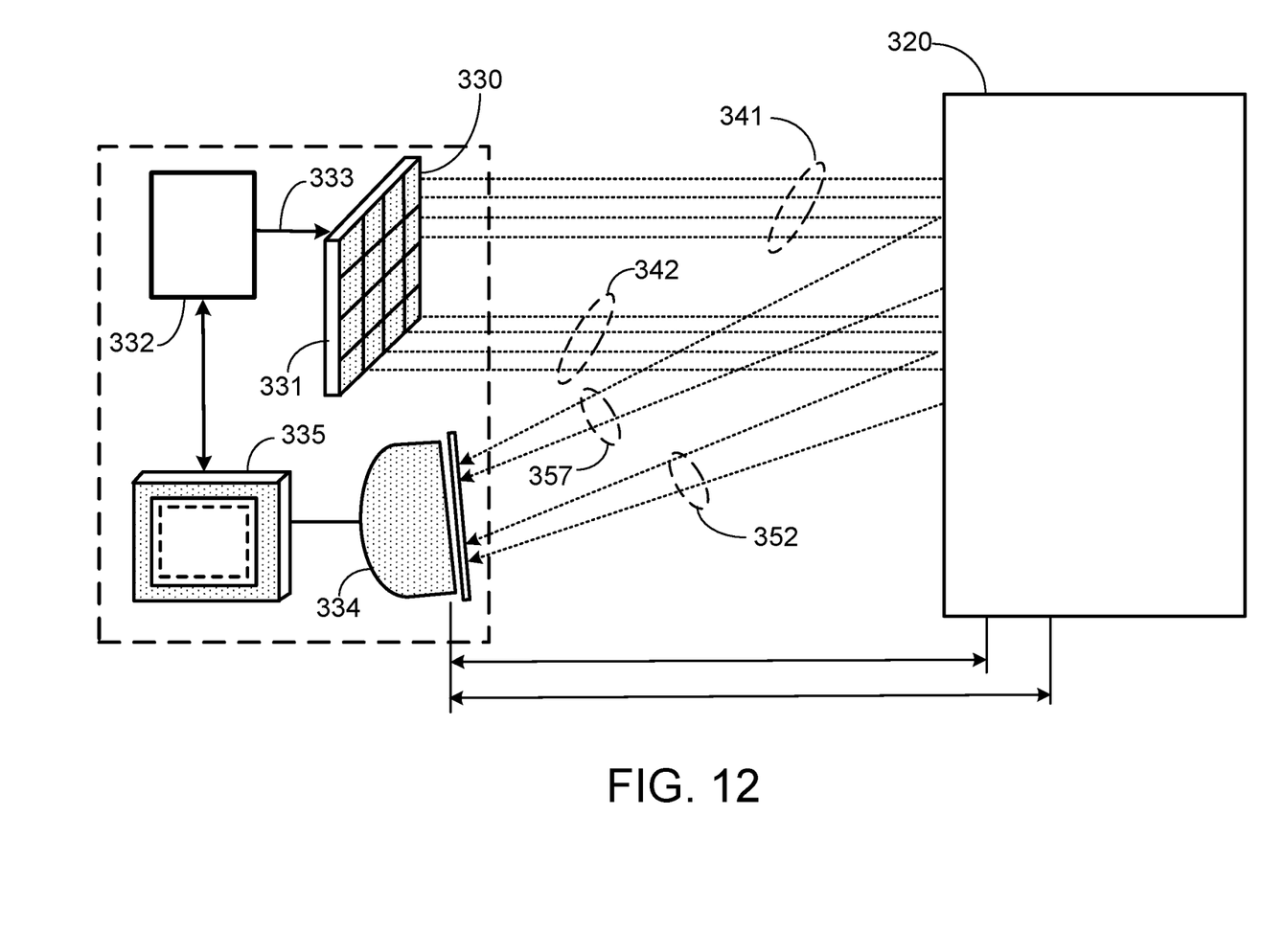
FIG. 12 illustrates an example of an imaging or sensing apparatus that includes an array of separately addressable linear VCSEL sub-arrays.

A monolithic two-dimensional VCSEL array including multiple, separately addressable, linear VCSEL sub-arrays can be used in various applications including, for example, three-dimensional sensing and imaging applications. As shown in the example of FIG. 12, an optical source 330 includes a VCSEL array chip having one or more separately addressable, linear VCSEL sub-arrays operable to illuminate an object or region of interest. The linear VCSEL sub-arrays may be, for example, any of the embodiments described above in connection with FIGS. 2-10. The array chip can be mounted, for example, on a thermal submount 331 for external cooling of the optical source. Some implementations include one or more optical components (e.g., lenses) integrated with the VCSEL sub-arrays to provide beam shaping.

The apparatus of FIG. 12 further includes a programmable current driver 332 operable to activate the illumination source 330 in any of one or more modes of operation, including activating (or deactivating) selectively one or more of the individually addressable linear VCSEL sub-arrays. For example, in one mode of operation, the programmable current driver 332 provides current pulses 333 to activate one or more linear VCSEL sub-arrays in a pre-determined sequence. Narrow beams of radiation are generated and illuminate respective different areas of the object or region of interest 320, one at a time. In the illustrated example, incident beams collectively shown as 341 (or 342) are generated to illuminate a particular horizontal plane. The incident beams 341 (342) may be generated one at a time, or all at once, depending upon the resolution required in a particular application. In some cases, several sets of beams, each one in a different horizontal plane, provide structured illumination in an area of interest following a pre-determined programming sequence.

Radiation emanating from the optical source 330 and incident upon the object 320 is reflected off of the object as reflected beams (collectively shown as 351 or 352). Although some part of the incident radiation may be scattered depending upon the surface features of the object 320, a significant part of the incident radiation is reflected.

A receiver 334 can be placed at a pre-determined angle with the optical source to detect the reflected radiation. The receiver may be in the form of an analog or a digital camera, a charge couple device (CCD), array of photodetectors, or any other receiver that may be operated in the wavelength of the incident radiation including visible and infrared wavelengths.

A processor 335 is operable to receive a signal proportional to the received reflected radiation. In some instances, the programmable current driver 332 and the processor 335 may be combined in an instrument having a microprocessor and a memory device to provided control, measurement, analog or/and digital signal processing (ASP/DSP) and data analysis and data storage capabilities. The input to the processor may be entered from external interfaces of the instrument or may be pre-programmed in the internal memory. In some instances, the instrument also may include the programmable current driver and signal receivers that may be interfaced with a computer to provide control, measurement, ASP/DSP and data analysis and data storage functions.

One or more linear VCSEL arrays as described above (e.g., FIGS. 2-10) can be used in other applications as well. Such applications include, but are not limited to, proximity/distance sensing and measurement, time-of-flight (TOF) sensing and imaging applications, among others. In some applications, the VCSELs in all the linear sub-arrays, or in a sub-group of the linear VCSEL sub-arrays, may be activated at the same time. In some instances, the VCSELs may be turned on and off in a pulsed mode of operation.

In some cases, one or more linear VCSEL arrays or VCSEL array chips described herein can be integrated into host devices such as smartphones, laptops, wearable devices, other computers, and automobiles. The host devices may include processors and other electronic components, and other supplemental modules configured to collect data, such as cameras, time-of-flight imagers. Other supplemental modules may be included such as ambient lighting, display screens, automotive headlamps, and the like. The host devices may further include non-volatile memory where instructions for operating the optoelectronic modules, and in some instances the supplemental modules, are stored.

In some instances, the accuracy of collected data can be improved by incorporating an optical source that includes one or more linear VCSEL arrays or VCSEL array chips as described above into an optoelectronic module or host device. Improving the accuracy of the collected data can, in turn, improve the operation of the host device, for example, with respect to operations or functions that respond to, or are based on the collected data. As an example, a host device such as a smartphone may include a supplemental module, such as a display screen configured to respond to signals collected by an optical sensor (sometimes referred to as an optical receiver) in the host device. In some cases, the response of the display screen includes altering the state of the display screen. Further, in some instances, the host device (e.g., a smartphone) includes a supplemental module such as an audio device (e.g., a speaker and/or a microphone) configured to respond to signals collected by the optical sensor. The response of the audio device can include, for example, altering the volume and/or sensitivity of the audio device.

An optical source including one or more linear VCSEL arrays of VCSEL array chips as described above can be mounted, for example, on a printed circuit board. The printed circuit board may be a constituent of a host device such as a hand-held communications or computing device (e.g., a mobile phone, smart phone, personal digital assistant (PDA) or laptop). A smart phone, for example, may include a processor, memory, an input/output device (including an interactive display), a communications interface, a transceiver, and an optical sensor (sometimes referred to as an optical receiver), among other components. The various components can be interconnected using various buses, and several of the components may be mounted on a common motherboard or in other manners as appropriate. The optical source also can be interconnected to other components in the smart phone device and, in some implementations, can be mounted on the common motherboard with some of the other components.

Various modifications can be made to the foregoing examples, and features described in connection with different implementations may be combined in some cases. Further, some features described above may be omitted in some implementations. Accordingly, other implementations are within the scope of the claims.

What is claimed is:

1. An optical source comprising:
    a linear array of VCSELs arranged along a transmission line including a first conductive contact pad at the first end and a second conductive pad at a second end, wherein the VCSELs are electrically connected together, and are electrically connected to the transmission line,
    wherein each of the VCSELs has a respective aperture, and wherein each of the apertures has a respective size such that apertures of VCSELs closer to the at least one of the first or second contact pads are smaller than apertures of VCSELs in a middle region of the transmission line; and wherein the transmission line is wider at the first end and the second end than in the middle region.

2. The optical source of claim 1 wherein the respective apertures of the VCSELs are increasingly larger in a direction away from at least one of the first or second contact pads.

3. The optical source of claim 1 wherein the respective sizes of the VCSEL apertures are such that the VCSELs are operable to emit substantially homogenous optical power.

4. The optical source of claim 1 wherein the respective sizes of the VCSEL apertures are such that the VCSELs are operable to project a non-homogenous optical power.

5. The optical source of claim 1 wherein a density of the VCSELs continuously increases from the first end toward the middle region, and wherein the density of the VCSELs continuously increases from the second end toward the middle region.

6. An apparatus for optical sensing or imaging comprising:
    the optical source as in claim 1 operable to illuminate an object with radiation;
    a current driver operable to activate the optical source;
    a receiver operable to detect radiation reflected by the object; and
    a processor operable to receive and process a signal proportional to the detected radiation.

* * * * *